United States Patent [19]
Boutillier et al.

[11] Patent Number: 6,147,868
[45] Date of Patent: Nov. 14, 2000

[54] ELECTRONIC POWER COMPONENTS MODULE

[75] Inventors: Hervé Boutillier, Chatou; Jannick Guinet, Soisy-Sous-Montmorency; Nicolas Hertzog; Olivier Theron, both of Rueil-Malmaison, all of France

[73] Assignee: Schneider Electric SA, Boulogne Billancourt, France

[21] Appl. No.: 09/263,215

[22] Filed: Mar. 5, 1999

[30] Foreign Application Priority Data

Mar. 19, 1998 [FR] France .................................. 98 03516

[51] Int. Cl.⁷ ...................................................... H05H 7/20
[52] U.S. Cl. ........................... 361/707; 257/707; 257/713
[58] Field of Search ................... 165/80.2, 80.3, 165/185; 174/16.3; 257/706–707, 712–713; 361/704, 707, 715, 717–718, 722

[56] References Cited

U.S. PATENT DOCUMENTS

| | | | |
|---|---|---|---|
| 4,685,081 | 8/1987 | Richman | 257/713 |
| 4,947,234 | 8/1990 | Einzinger et al. | 257/713 |
| 5,398,160 | 3/1995 | Umeda | 361/707 |
| 5,569,950 | 10/1996 | Lewis et al. | 257/713 |
| 5,761,039 | 6/1998 | Bruees et al. | 361/704 |
| 5,926,372 | 7/1999 | Rinehart et al. | 361/704 |

FOREIGN PATENT DOCUMENTS

| | | |
|---|---|---|
| 0 809 292 | 11/1997 | European Pat. Off. . |
| 196 30 902 | 2/1998 | Germany . |

*Primary Examiner*—Gregory Thompson
*Attorney, Agent, or Firm*—Oblon, Spivak, McClelland, Maier & Neustadt, P.C.

[57] ABSTRACT

A module including at least two electrical components such as thyristors including a temperature sensor soldered on two conducting strips on a flat cable formed by a flexible dielectric plastic film glued onto the metallic electrode forming the top of one of the components and approximately at its center.

4 Claims, 2 Drawing Sheets

ELECTRONIC POWER COMPONENTS MODULE

BACKGROUND OF THE INVENTION

1. Field of the Invention

This invention relates to a module containing electronic power components such as thyristors.

2. Discussion of the Background

Modules consisting of two thyristors connected to each other are used in many electrical devices, in order to form a bridge arm. In starters, these modules need to be equipped with a temperature sensor, the temperature information being used to protect the thyristors.

SUMMARY OF THE INVENTION

The purpose of this invention is to provide a thyristors module equipped with a temperature sensor.

The module according to the invention is characterized by the fact that it comprises a temperature sensor soldered onto two conducting strips of a flat cable formed by a film of flexible dielectric plastic glued onto the metallic electrode forming the top of one of the components, approximately in its center.

BRIEF DESCRIPTION OF THE DRAWINGS

The invention will now be described in more detail with reference to an embodiment given as an example and shown in the attached drawings in which.

DISCUSSION OF THE PREFERRED EMBODIMENTS

Figure 1:
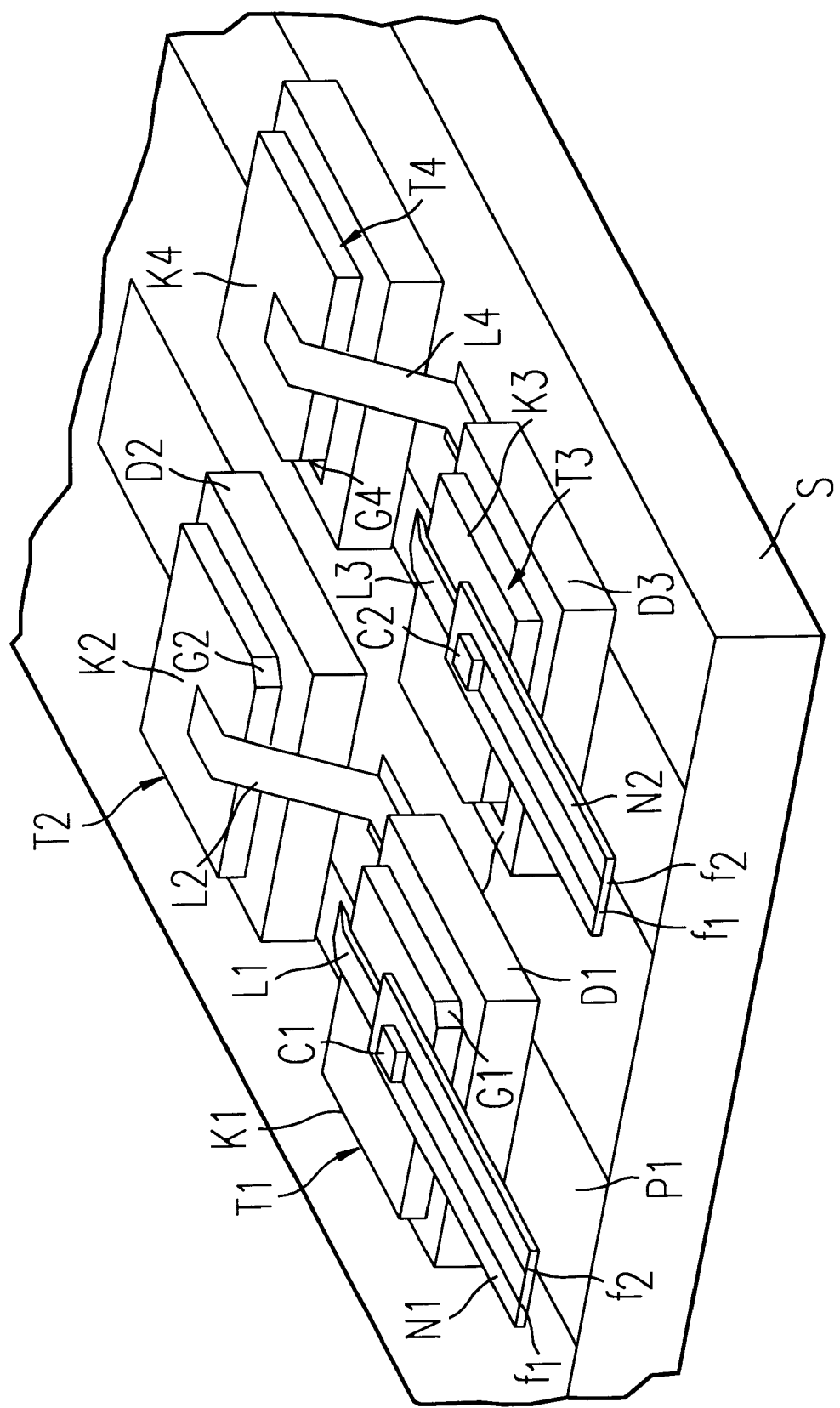
FIG. 1 is a perspective view of a thyristors module according to the invention.
Figure 2:
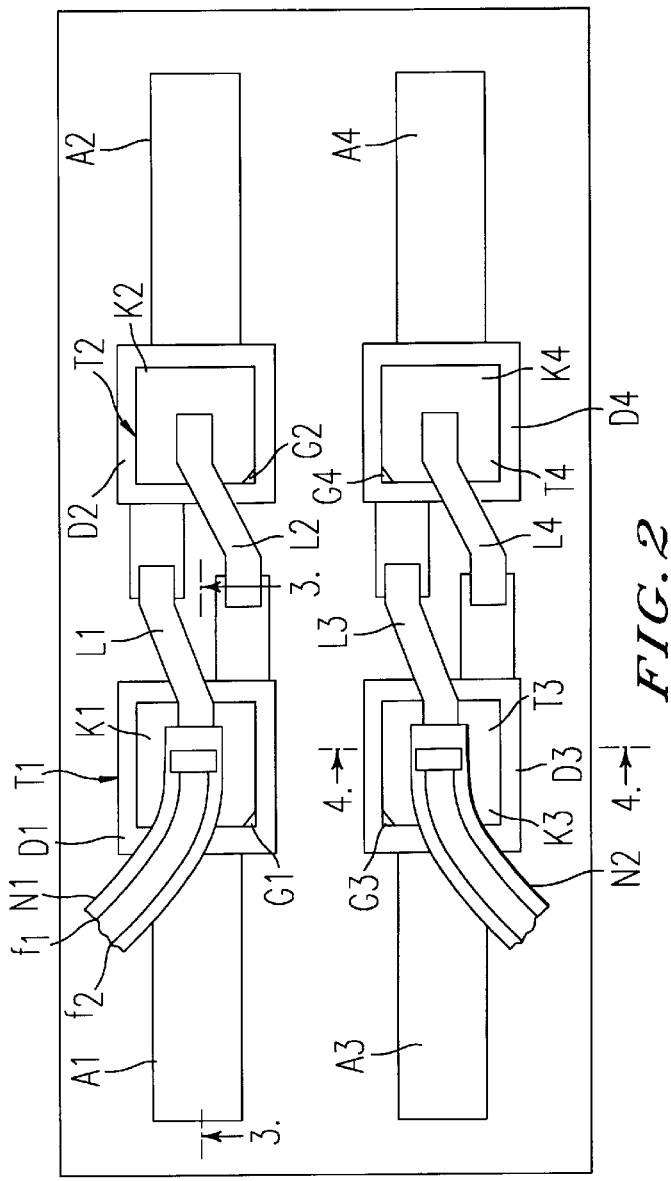
FIG. 2 is a top view of the module in FIG. 1.

The module shown in FIGS. 1 and 2 comprises two thyristors T1–T2 mounted top-bottom in order to form a first arm of a bridge and two thyristors T3–T4 mounted top-bottom to form a second arm of the bridge. Each of these thyristors T1, T2, T3, T4 is mounted above a heat sink D1, D2, D3, D4, to which it is soldered through its anode. Each of these heat sinks D1, D2, D3, D4 is made of a conducting metal (for example copper), the metal being soldered to a metallized substrate S. This substrate S is provided with metallized strips A1, A2 forming power connections for the first bridge and metallized strips A3, A4 forming power connections for the second bridge.

The power connection strip A1 is electrically connected to the fixed conducting heat sink D1 through the anode, under thyristor T1. It extends under this heat sink D1 so that it is connected through a copper foil connection L2 to the cathode K2 of thyristor T2.

The cathode K1 of thyristor T1 is soldered to a copper foil connection L1 soldered onto the power connection strip A2 soldered below the conducting heat sink D2 which is connected through the anode to thyristor T2.

Similarly, the metallized strip A3 is electrically connected to the conducting heat sink D3 fixed through the anode under thyristor T3. It extends under this heat sink D3 so that it can be connected through a copper foil connection L4 to the thyristor cathode K4.

The thyristor cathode K3 is soldered to a copper foil connection L3 soldered to the power connection strip A4 soldered below the conducting heat sink D4 which is connected through the anode to thyristor T4.

The triggers of thyristors T1, T2, T3, T4 are marked G1, G2, G3, G4 respectively.

The temperature of each arm T1–T2 or T3–T4 is measured by a temperature sensor C1, C2 mounted above one of the two thyristors T1 or T3 respectively.

Figure 4:
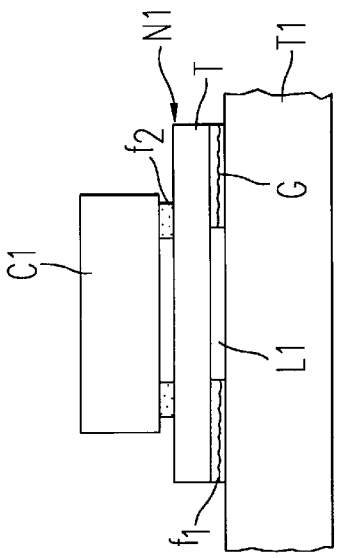
FIG. 4 shows the detail along IV—IV in FIG. 2.
Figure 3:
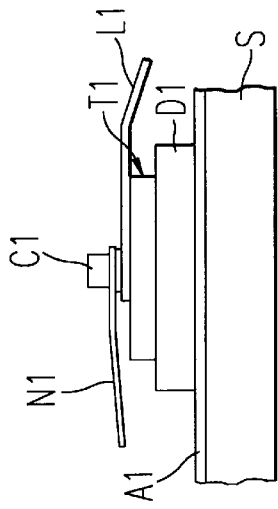
FIG. 3 shows a section along III—III in FIG. 2.

Each temperature sensor C1 and C2 is mounted on a flat cable N1 or N2 consisting of a flexible dielectric plastic film I (as shown in FIG. 4) on which two conducting strips f1, f2 are laid out. The SMC type temperature sensor C1 or C2 is soldered on the two conducting strips f1 and f2 of flat cable N1 or N2, on the same side as its metallized surface. The dielectric side of this flat cable (the side opposite the conducting strips) is soldered or glued onto the top metallic electrode (cathode) of the thyristor through a connecting pad G (as shown in FIG. 4). The temperature sensor is located approximately at the center of the thyristor.

Obviously, it would be possible to imagine variants and detailed improvements, and even to envisage the use of equivalent means, without going outside the scope of the invention.

What is claimed is:

1. A module comprising at least two electrical components configured for high power applications, said module including at least one temperature sensor fixed on and electrically connected to two conducting strips provided on a flat surface of a flexible dielectric plastic film cable with the cable being fixed to the top of one of the components so that the at least one temperature sensor is substantially centrally positioned and held above the one of the components.

2. The module according to claim 1, wherein the temperature sensor is of SMC type.

3. The module according to claims 1 or 2, wherein the at least two electrical components are thyristors electrically connected to heat sinks made of conducting metal, said heat sinks being positioned beneath said thermistors and electrically connected to electrically conductive strips forming power connections, said thyristors, heat sinks, and electrically conductive strips being provided on a substrate.

4. The module according to claims 1 or 2, wherein the at least two electrical components are a first thyristor having a first cathode and a second thyristor having a second cathode and wherein a first power connection strip is electrically connected to a first conducting heat sink fixed under the first thyristor and further electrically connected to the second cathode of the second thyristor and a second power connection strip is electrically connected to a second conducting heat sink fixed under the second thyristor and further electrically connected to the first cathode of the first thyristor.

* * * * *